(12) United States Patent
Mizuno

(10) Patent No.: US 7,782,917 B2
(45) Date of Patent: Aug. 24, 2010

(54) LASER DRIVING CIRCUIT, OPTICAL PICKUP AND RECORDING/READING EQUIPMENT

(75) Inventor: Haruhiko Mizuno, Osaka (JP)

(73) Assignee: Panasonic Corporation, Osaka (JP)

( * ) Notice: Subject to any disclaimer, the term of this patent is extended or adjusted under 35 U.S.C. 154(b) by 282 days.

(21) Appl. No.: 11/755,346

(22) Filed: May 30, 2007

(65) Prior Publication Data

US 2007/0280315 A1  Dec. 6, 2007

(30) Foreign Application Priority Data

May 31, 2006  (JP) .............................. 2006-150963

(51) Int. Cl.
*H01S 3/00* (2006.01)
(52) U.S. Cl. ............... 372/38.07; 372/38.02; 372/38.05
(58) Field of Classification Search .... 372/38.01–38.09
See application file for complete search history.

(56) References Cited

U.S. PATENT DOCUMENTS

| | | | |
|---|---|---|---|
| 5,191,589 A | 3/1993 | Amano et al. | |
| 5,224,111 A * | 6/1993 | Stilwell et al. | 398/5 |
| 5,514,989 A | 5/1996 | Sato et al. | |
| 6,490,301 B1 | 12/2002 | Tatehara et al. | |
| 6,717,968 B2 | 4/2004 | Tatehara et al. | |
| 7,046,706 B2 | 5/2006 | Tatehara et al. | |
| 7,064,696 B2 | 6/2006 | Ohkubo et al. | |
| 2004/0114486 A1 | 6/2004 | Tanase | |
| 2006/0153259 A1* | 7/2006 | Kimura et al. | 372/38.02 |

FOREIGN PATENT DOCUMENTS

| | | |
|---|---|---|
| JP | 05-021877 | 1/1993 |
| JP | 06-140700 | 5/1994 |
| JP | 06-196746 | 7/1994 |
| JP | 07-095610 | 10/1995 |
| JP | 08-037331 | 2/1996 |
| JP | 2003-218456 | 7/2003 |

* cited by examiner

*Primary Examiner*—Armando Rodriguez
*Assistant Examiner*—Xnning Niu
(74) *Attorney, Agent, or Firm*—RatnerPrestia

(57) ABSTRACT

Disclosed is a laser driving technique capable of reducing power consumption in a laser driving circuit to achieve reduced heat generation in an optical pickup of a recording/reading equipment for an optical disc. A base-voltage control circuit is connected to a base of a grounded-base cascode transistor connected between a driver circuit and a laser diode (LD), and a LD-anode-voltage control circuit is connected to an anode of the laser diode. The base-voltage control circuit and the LD-anode-voltage control circuit are connected to a controller, and operable to variously change an anode voltage of the laser diode and a base voltage of the cascode transistor depending on a driving current for the laser diode.

7 Claims, 9 Drawing Sheets

*Fig.8* PRIOR ART

LASER DRIVING CIRCUIT, OPTICAL PICKUP AND RECORDING/READING EQUIPMENT

RELATED APPLICATION

This application is based on Japanese Patent Application No. 2006-150963, the contents of which are incorporated herein by reference.

BACKGROUND OF THE INVENTION

The present invention relates to a laser driving circuit for driving a laser to emit a laser beam therefrom. In particular, the present invention relates to a recording/reading equipment capable of recording/reading a video signal or the like onto/from an optical disc, such as a CD, a DVD or a Blu-ray Disc (BD).

Generally, in an optical disc, a semiconductor laser element is used for forming a recording mark thereon, and operated to generate a laser beam in a pulsed manner so as to control a heating temperature to prevent the recording mark from being deformed into a tearful eye shape. Late years, in connection with developments aiming for higher-speed recording, a laser-pulse width has become narrower. This involves the need for a laser driving circuit capable of performing a switching action at a higher speed with shorter pulse rise/fall times. Moreover, the higher-speed recording leads to an increase in power consumption of a laser driving circuit, which causes a problem about an increase in heat generation at an optical pickup.

In a conventional laser driving circuit, there has been known a technique of inserting a grounded-base cascode circuit, between a current mirror circuit and a semiconductor laser (i.e., laser diode), as disclosed, for example, in JP 2003-218456 A. This laser driving circuit is intended to suppress impedance fluctuations in the laser and band fluctuations due to the Miller effect so as to achieve shorter rise/fall times in a laser-pulse waveform.

Specifically, in one type of conventional laser driving circuit as shown in FIG. 8, when a base voltage source 808 for a grounded-base cascode transistor 805 is set to have a certain fixed voltage, the base voltage will be determined by a maximum current to be supplied from a driver circuit 801 to a semiconductor laser 804, and an operating voltage which is necessary for the driver circuit 801 to supply the maximum current. Along with a progress in higher-speed recording, the laser 804 is required to have higher laser-beam generating power so as to perform the recording in a shorter period of time, and therefore a current value for driving the laser 804 (i.e., laser driving current) has to be increased. In this case, an influence of an impedance of the driver circuit 801 becomes prominent, causing the need for increasing the operating voltage necessary for the driver circuit 801 and therefore the need for increasing the base voltage of the cascode transistor 805. Moreover, in conjunction with the increase in the base voltage of the cascode transistor 805, it is inevitably required to increase a collector voltage of the cascode transistor 805 and an anode voltage of the laser 804, resulting in increased power consumption.

In the above laser driving circuit, a maximum value of the laser driving current is determined while taking account of production tolerance of the laser 804 and power degradation in an end-of-life stage thereof. That is, the maximum value is set with a relatively large margin with respect to a value during normal use, i.e., the laser driving circuit is operated during the normal use to supply a current lower than a maximum output current thereof (i.e., the maximum laser driving current). Thus, during the normal use, the influence of the impedance of the driver circuit 801 is reduced in proportion to the lower laser driving current, and therefore the operating voltage necessary for the driver circuit 801 becomes lower to allow the base voltage of the cascode transistor 805 to be reduced by just that much. This means that, if the base voltage is fixed based on the maximum output current, wasteful electric power will be consumed during the normal use.

FIG. 9 shows another type of conventional laser driving circuit, wherein a cascode circuit is used in a current discharging type of laser driving circuit. In this laser driving circuit, as a laser driving current is increased, a source voltage of a driver circuit 901 has to be set at a higher value, or a cathode voltage of a semiconductor laser 904 has to be set at a lower value. Further, if each of the source voltage of the driver circuit 901, a base voltage of a grounded-base cascode transistor 905 and the cathode voltage of the laser 904 is determined based on a maximum output current of the driver circuit 901, wasteful electric power will be consumed during normal use, as with the aforementioned type.

FIG. 10 shows an outline of an optical pickup. During an operation of recording/reading a record on an optical disc, a laser driving circuit is operable, according to control of a controller, to supply a current to a semiconductor laser so as to allow the laser to emit a laser beam. This laser beam is emitted onto the optical disc through a collimator lens, a beam splitter and an objective lens. Then, the leaser beam reflected by the optical disc is transmitted to a photodetector through the beam splitter and a cylindrical lens, and converted from an optical signal to an electrical signal through the photodetector. In a recording/reading equipment for an optical disc, the electrical signal is input into the controller through an RF amplifier to read the record. An amount of heat to be generated in the optical pickup is closely related to power consumption in the laser. Thus, a reduction of power consumption in the laser and the laser driving circuit is an effective way to reduce the heat generation in the optical pickup. The reduction of heat generation in the optical pickup is also effective in reducing heat generation in the recording/reading equipment.

SUMMARY OF THE INVENTION

In view of the above circumstances, it is an object of the present invention to provide a technique of reducing heat generation in an optical pickup of a recording/reading equipment for an optical disc, wherein each of a base voltage of a grounded-base cascode transistor, an anode or cathode voltage of a semiconductor laser and a source voltage of a driver circuit is controlled according to a laser driving current to lower a voltage applied across the laser driving circuit and the laser when the laser driving current is set at a relatively low value so as to reduce power consumption in the laser driving circuit and the laser, particularly, during normal use.

In order to achieve the above object, the present invention provides a laser driving circuit which comprises a laser-connecting terminal to which one electrode of a semiconductor laser is connected, a driver circuit adapted to supply a current to the laser, a grounded-base circuit connected between the laser and the driver circuit, and a base-voltage control circuit connected to the grounded-base circuit and adapted to control a base voltage of the grounded-base circuit.

The laser driving circuit of the present invention may include a controller connected to each of the driver circuit and the base-voltage control circuit, and adapted to set a value of the current to be supplied from the driver circuit to the laser connected to the laser-connecting terminal.

The above laser driving circuit may further include an electrode-voltage control circuit connected to each of the controller and the other electrode of the laser, and adapted to control a voltage at the other electrode of the laser.

The above laser driving circuit may further include a source-voltage control circuit connected to each of the controller and the driver circuit, and adapted to control a source voltage of the driver circuit.

In the laser driving circuit of the present invention, the base-voltage control circuit may include a digital-analog converter circuit.

In the laser driving circuit of the present invention, the base-voltage control circuit may include a current-voltage converter circuit adapted to convert a current value corresponding to the setup current value of the driver circuit, to a voltage value.

According to the present invention, each of the base voltage of the grounded-base circuit, the electrode voltage, i.e., anode or cathode voltage, of the laser and the source voltage of the driver circuit can be controlled according to the laser driving current to lower a voltage applied across the laser driving circuit and the laser when the laser driving current is set at a relatively low value so as to reduce power consumption in the laser driving circuit and the laser, particularly, during normal use. This makes it possible to reduce heat generation in an optical pickup of a recording/reading equipment for an optical disc.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which.

DETAILED DESCRIPTION OF THE PREFERRED EMBODIMENTS

With reference to the drawings, a laser driving circuit according to an embodiment of the present invention will now be described.

First Embodiment

Figure 1:
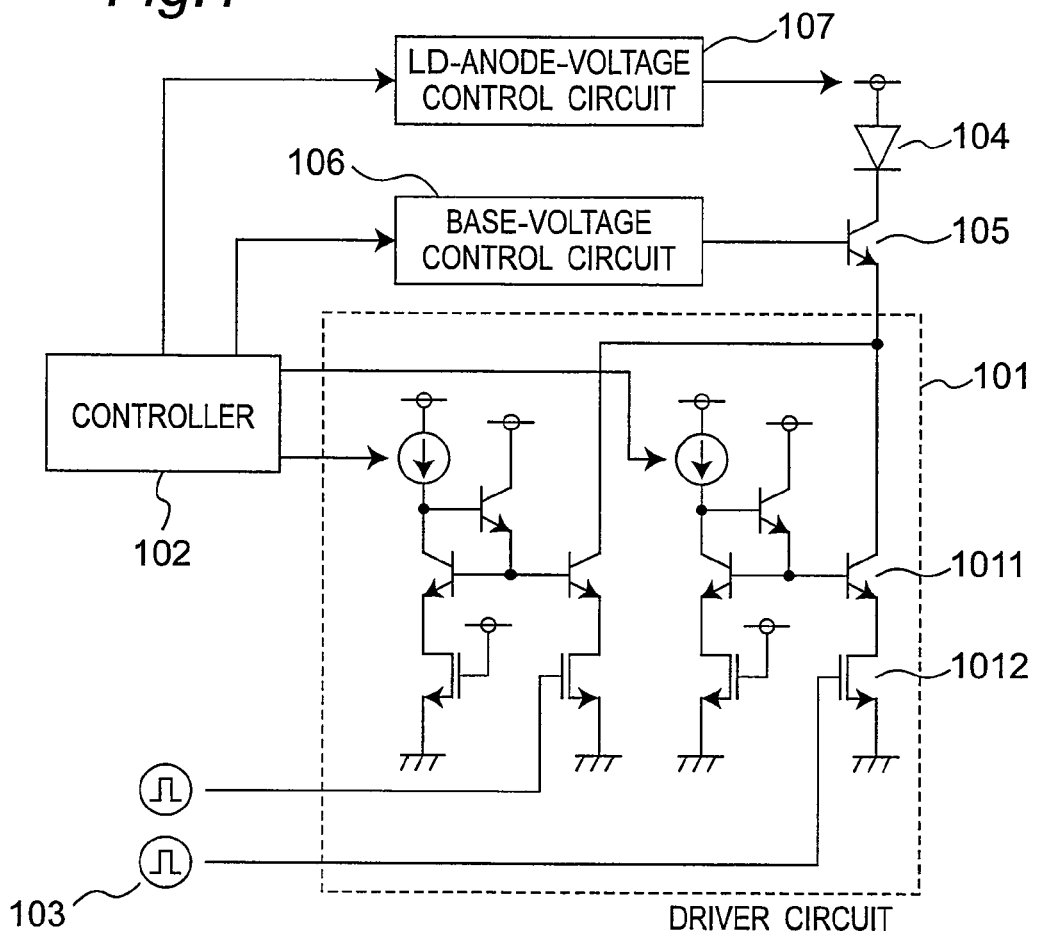
FIG. 1 is a circuit diagram showing the configuration of a laser driving circuit according to a first embodiment of the present invention.

FIG. 1 is a circuit diagram showing the configuration of a laser driving circuit according to a first embodiment of the present invention. In FIG. 1, a driver circuit 101 includes a current mirror circuit for mirroring a current set by a controller 102. Specifically, a Nch MOS transistor 1012 is connected between an emitter of an NPN transistor 1011 constituting the current mirror circuit, and the ground (earth), and a pulse signal 103 (pulse signal generation section) is connected to the Nch MOS transistor 1012. That is, the Nch MOS transistor 1012 is adapted to be turned on/off according to the pulse signal 103, so that a pulsed current flows through a laser-connecting terminal to allow a semiconductor laser (i.e., laser diode (LD)) 104 to generate a laser beam in a pulsed manner so as to form a recording mark on an optical disc.

Typically, in a recording operation onto an optical disc, the laser is driven by a driving signal having a complicated waveform formed of a combination of a plurality of pulse signals. In FIG. 1, only two pulse signals 103 are illustrated for the sake of simplifying explanation.

A grounded-base cascode transistor 105 is connected between the driver circuit 101 and the laser 104 to reduce rise/fall times of a laser driving current corresponding to low/high states of the pulse signal 103. A base-voltage control circuit 106 is connected to a base of the cascode transistor 105. The base-voltage control circuit 106 is further connected to the controller 102. A LD-anode-voltage control circuit 107 is connected to an anode of the laser 104. The LD-anode-voltage control circuit 107 is further connected to the controller 102.

Based on the above configuration, a base voltage of the cascode transistor 105 and an anode voltage of the laser 104 can be variably changed individually. Specifically, respective maximum values of the base voltage of the cascode transistor 105 and the anode voltage of the laser 104 can be set correspondingly to a maximum value of the laser driving current, and each of the base voltage of the cascode transistor 105 and the anode voltage of the laser 104 can be lowered in proportion to the laser driving current when it is set at a lower value than the maximum value thereof.

As mentioned above, the maximum value of the laser driving current is determined while taking account of production tolerance of the laser and power degradation in an end-of-life stage thereof. That is, the maximum value is set with a relatively large margin with respect to a value during normal use, i.e., the laser driving circuit is operated during the normal use to supply a current lower than a maximum output current thereof (i.e., the maximum laser driving current).

Figure 2:
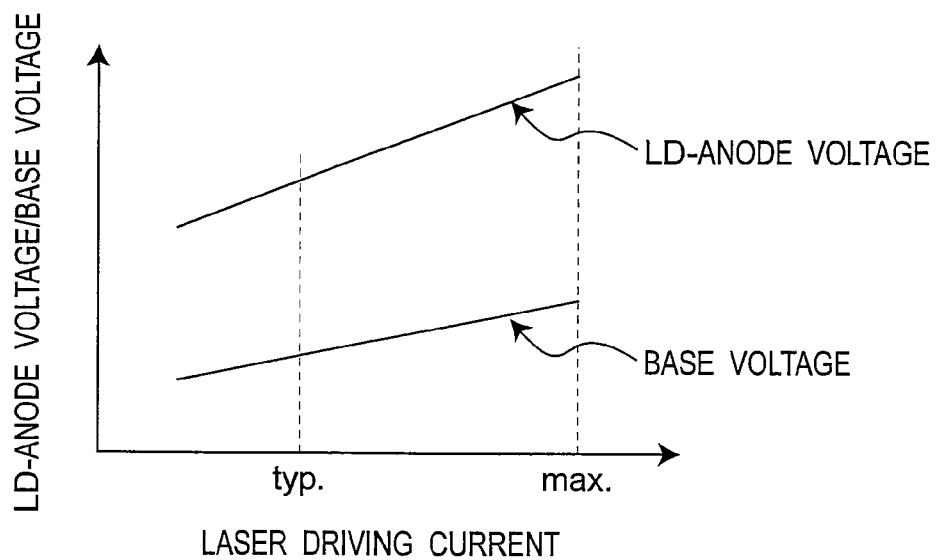
FIG. 2 is a graph showing a relationship between a laser driving current and each of an anode voltage of a laser diode (LD) and a base voltage of a grounded-base transistor, in the laser driving circuit according to the first embodiment.

Thus, as shown in FIG. 2, in the first embodiment, the base voltage of the cascode transistor 105 and the anode voltage of the laser 104 can be lowered during the normal use (typ.) as compared with during the maximum laser driving current (max.), to reduce power consumption. This makes it passable to reduce heat generation in an optical pickup of a recording/reading equipment for the optical disc.

Figure 3:
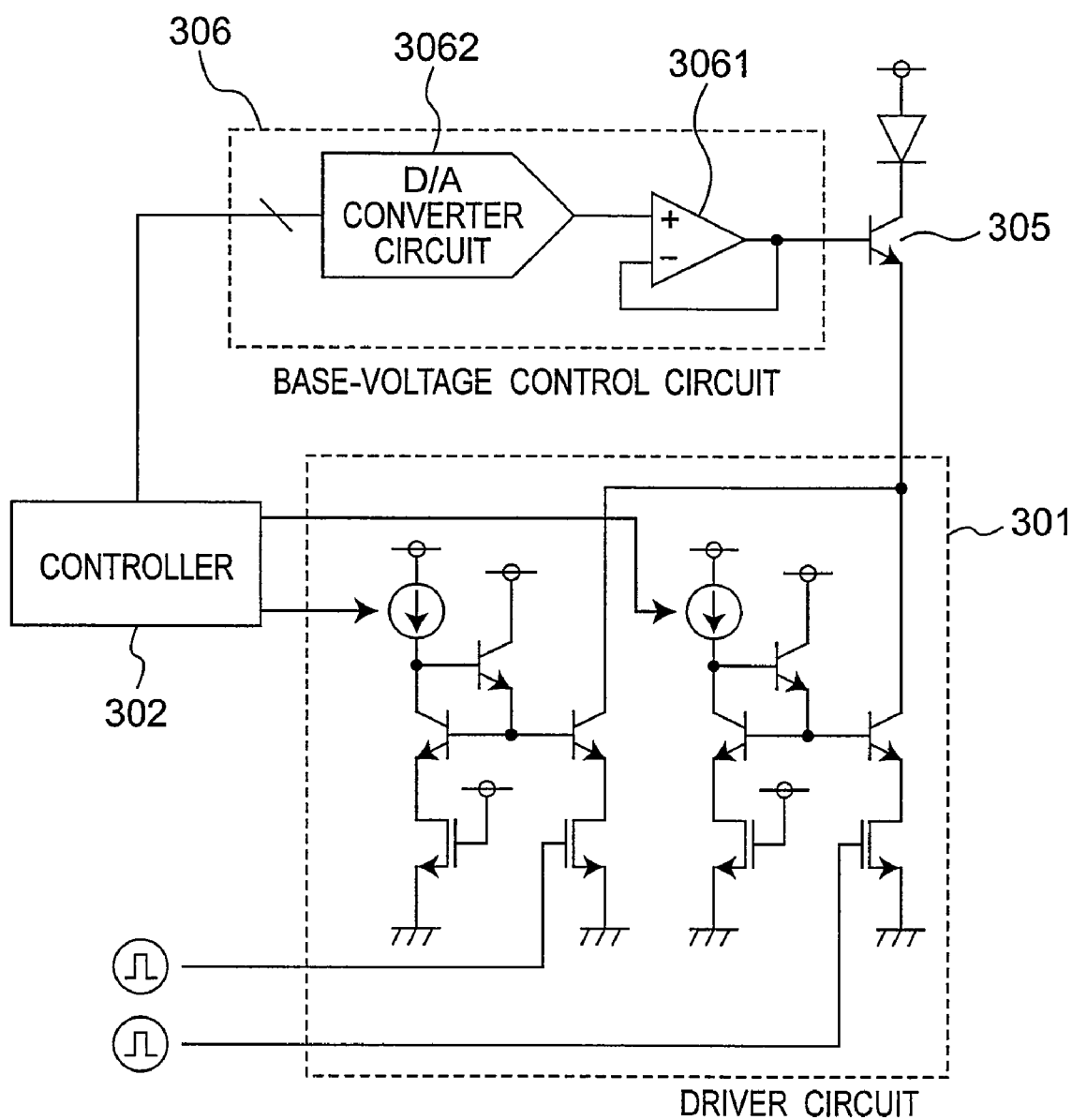
FIG. 3 is a circuit diagram showing one example of a base-voltage control circuit for used in the laser driving circuit according to the first embodiment.

FIG. 3 shows one specific example of the base-voltage control circuit. This base-voltage control circuit 306 comprises a D/A converter circuit 3062 and an operational amplifier 3061. In this example, a controller 302 is operable, after setting a laser driving current and generating a digital value corresponding to the laser driving current, to input the digital value into the base-voltage control circuit 306. Then, in the base-voltage control circuit 306, the D/A converter circuit 3062 is operable to convert the received digital value to an analog voltage, and apply the analog voltage to a base of a grounded-base cascode transistor 305 through the operational amplifier 3061. The operational amplifier 3061 is inserted as a means to lower an impedance of the base of the cascode transistor 305. The cascode transistor 305 is connected to a driver circuit 301.

Figure 4:
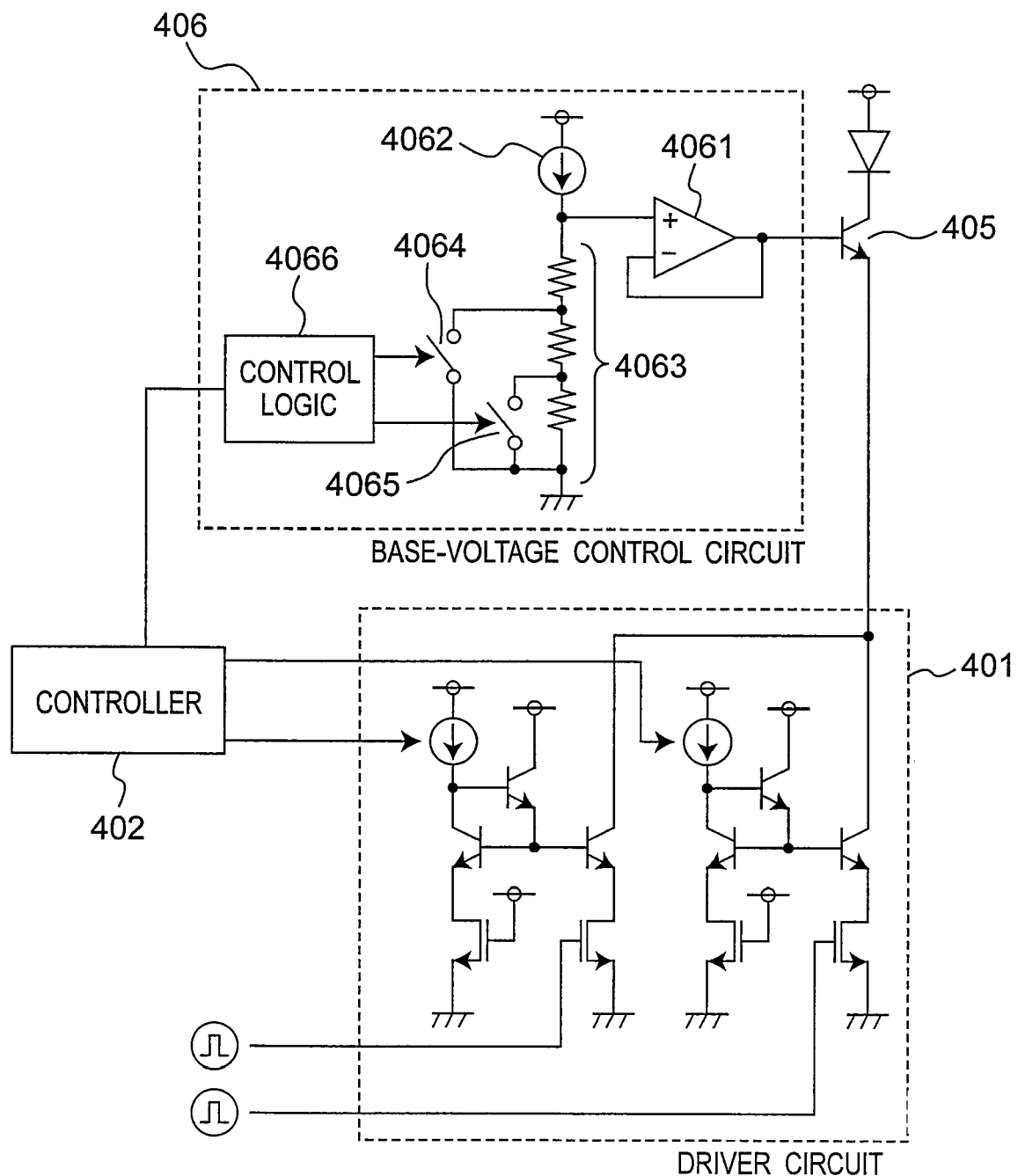
FIG. 4 is a circuit diagram showing another example of the base-voltage control circuit.

FIG. 4 shows another specific example of the base-voltage control circuit. This base-voltage control circuit 406 comprises a constant current source 4062, a resistor 4063, two switches 4064, 4065, control logic 4066 for controlling the switches 4064, 4065, and an operational amplifier 4061. In this example, a voltage determined by the constant current source 4062 and the resistor 4063 is connected to a base of a grounded-base cascode transistor 405 through the operational amplifier 4061. Each of the switches 4064, 4065 is controlled based on a laser driving current set by a controller 402 in such a manner that, when the laser driving current set at a relatively low value, at least one of the switches 4064, 4065 is turned on to short between both ends of a part of the resistor 4063 so as to lower a base voltage of the cascode transistor 405. The cascode transistor 405 is connected to a driver circuit 401. The base-voltage control circuit illustrated in FIG. 4 is designed to change the base voltage in three steps based on the switches 4064, 4065. Alternatively, according to need, the cascode transistor 405 may be designed to change a signal resolution level.

Figure 5:
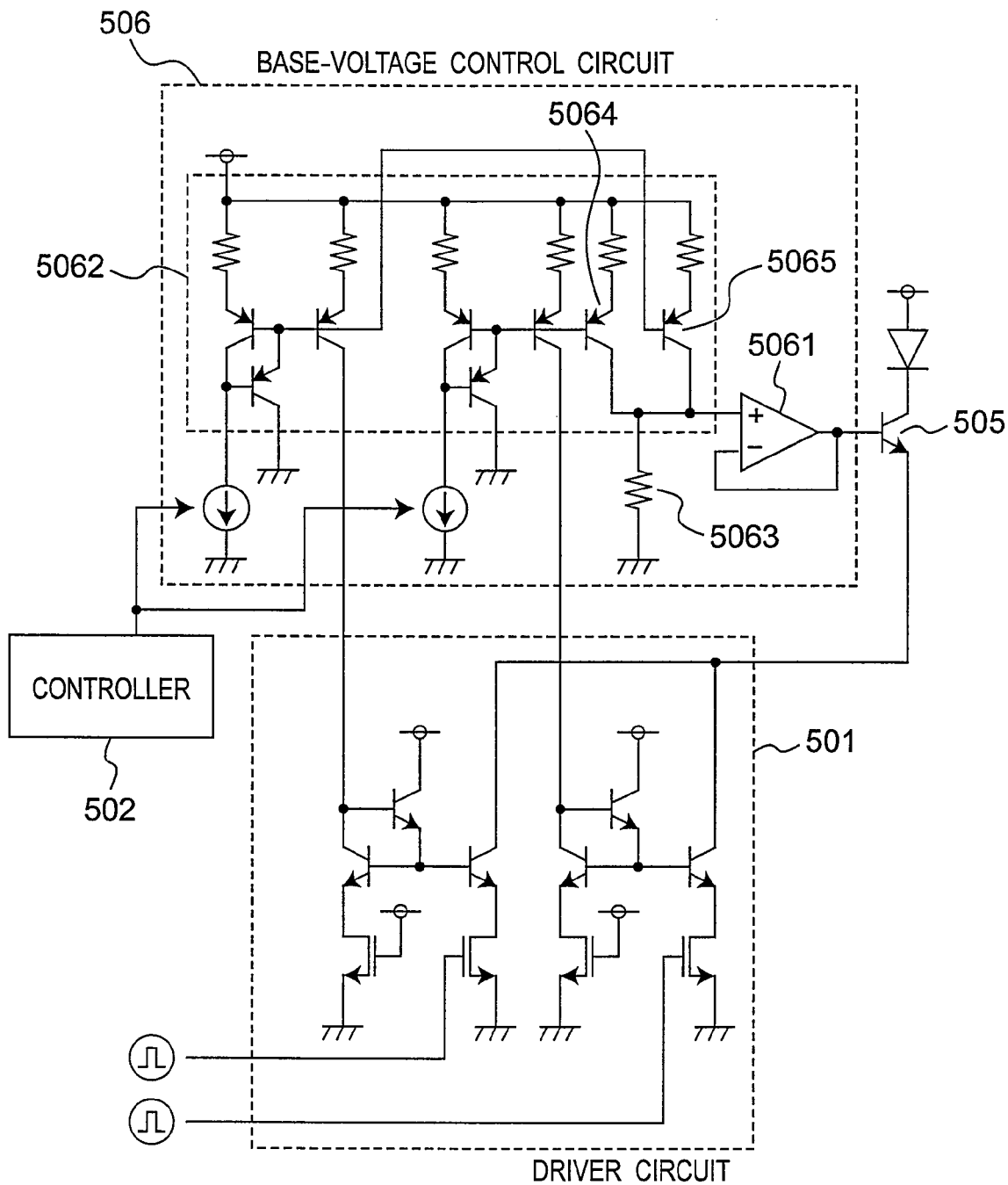
FIG. 5 is a circuit diagram showing yet another example of the base-voltage control circuit.

FIG. 5 shows yet another specific example of the base-voltage control circuit. This base-voltage control circuit 506 comprises a current mirror circuit 5062 adapted to variously change a current value depending on a current value set by a controller 502, a resistor 5063 and an operational amplifier 5061. In this example, the current mirror circuit 5062 is operable to supply a current to each of two PNP transistors 5064 and 5065, at a value corresponding to a laser driving current set by the controller 502. A voltage determined by the current value and a resistance value of the resistor 5063 is connected to a base of a grounded-base cascode transistor 505 through the operational amplifier 5061. The cascode transistor 505 is connected to a driver circuit 501.

Second Embodiment

Figure 6:
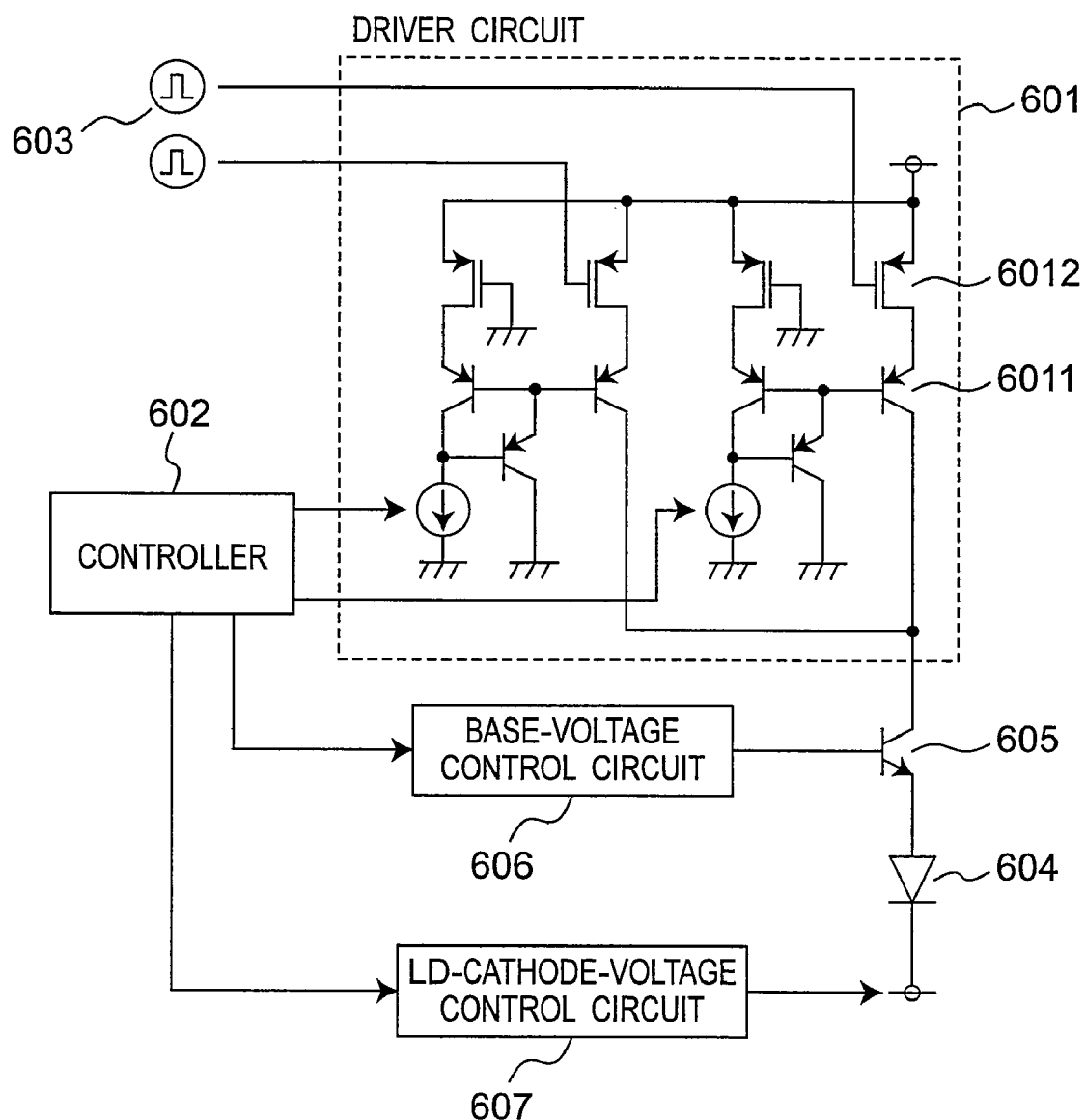
FIG. 6 is a circuit diagram showing the configuration of a laser driving circuit according to a second embodiment of the present invention.

A second embodiment of the present invention will be described below. FIG. 6 is a circuit diagram showing the configuration of a laser driving circuit according to the second embodiment. Differently from the laser driving circuit according the first embodiment which is designed to suck a current, the laser driving circuit according to the second embodiment is designed to discharge a current therefrom so as to drive a semiconductor laser 604.

In FIG. 6, a driver circuit 601 includes a current mirror circuit for mirroring a current set by a controller 602. Specifically, a Pch MOS transistor 6012 is connected between a voltage source and an emitter of a PNP transistor 6011 constituting the current mirror circuit, and a pulse signal 603 (pulse signal generation section) is connected to the Pch MOS transistor 6012. That is, the Pch MOS transistor 6012 is adapted to be turned on/off according to the pulse signal 603, so that the laser 604 generates a laser beam in a pulsed manner so as to form a recording mark on an optical disc.

A grounded-base cascode transistor 605 is connected between the driver circuit 601 and the laser 604 to reduce rise/fall times of a laser driving current corresponding to low/high states of the pulse signal. A base-voltage control circuit 606 is connected to a base of the cascode transistor 605. The base-voltage control circuit 606 is further connected to the controller 602. A LD-cathode-voltage control circuit 607 is connected to a cathode of the laser 604. The LD-cathode-voltage control circuit 607 is further connected to the controller 102.

Based on the above configuration, a base voltage of the cascode transistor 605 and a cathode voltage of the laser 604 can be variably changed individually. Specifically, respective maximum values of the base voltage of the cascode transistor 605 and the cathode voltage of the laser 604 can be set correspondingly to a maximum value of the laser driving current, and each of the base voltage of the cascode transistor 605 and the cathode voltage of the laser 604 can be increased in reverse proportion to the laser driving current when it is set at a lower value than the maximum value thereof.

Thus, in the second embodiment, the base voltage of the cascode transistor 605 and the cathode voltage of the laser 604 are increased during normal use as compared with during the maximum laser driving current. Thus, a voltage between the cathode of the laser 604 and the voltage source of the driver circuit can be lowered to reduce power consumption. This makes it passable to reduce heat generation in an optical pickup of a recording/reading equipment for the optical disc, as with the first embodiment.

Third Embodiment

Figure 7:
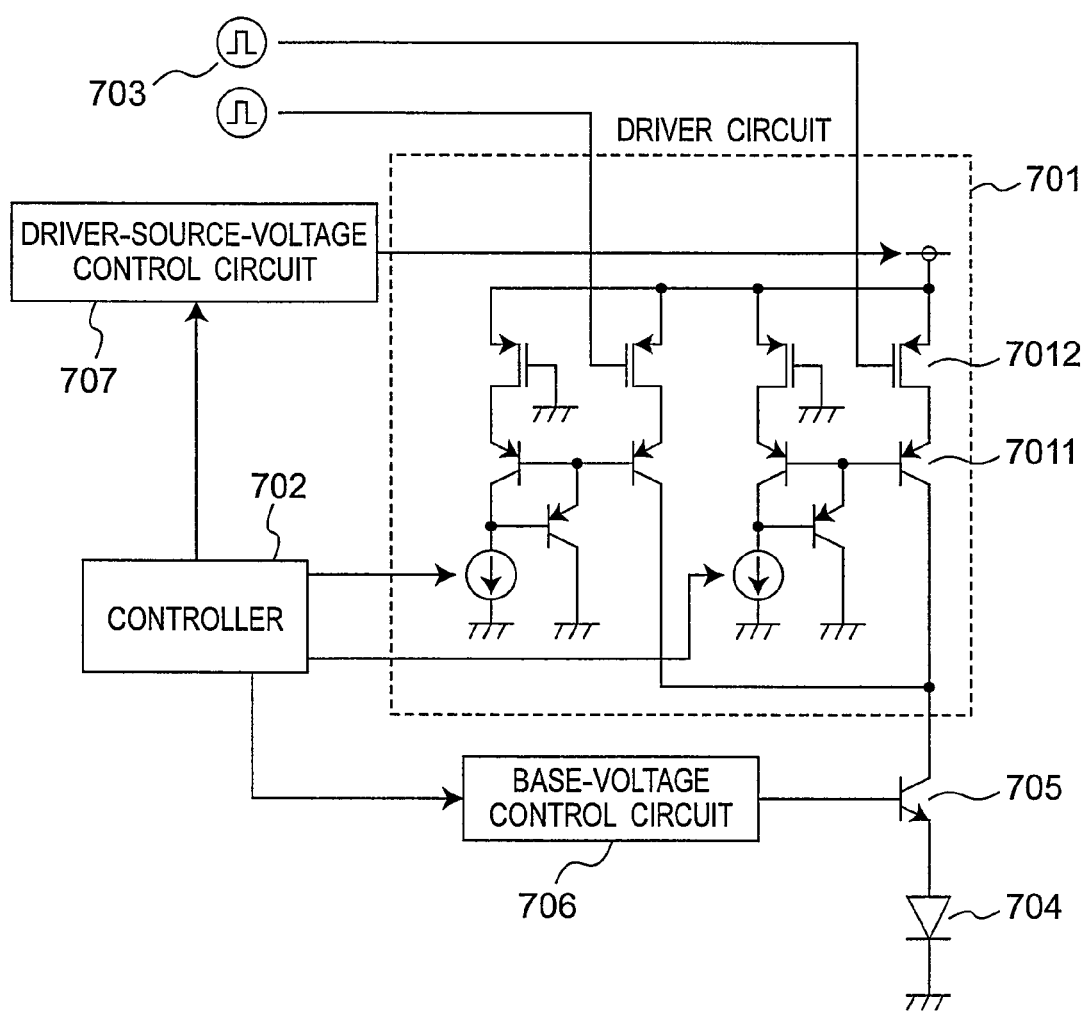
FIG. 7 is a circuit diagram showing the configuration of a laser driving circuit according to a third embodiment of the present invention.
Figure 8:
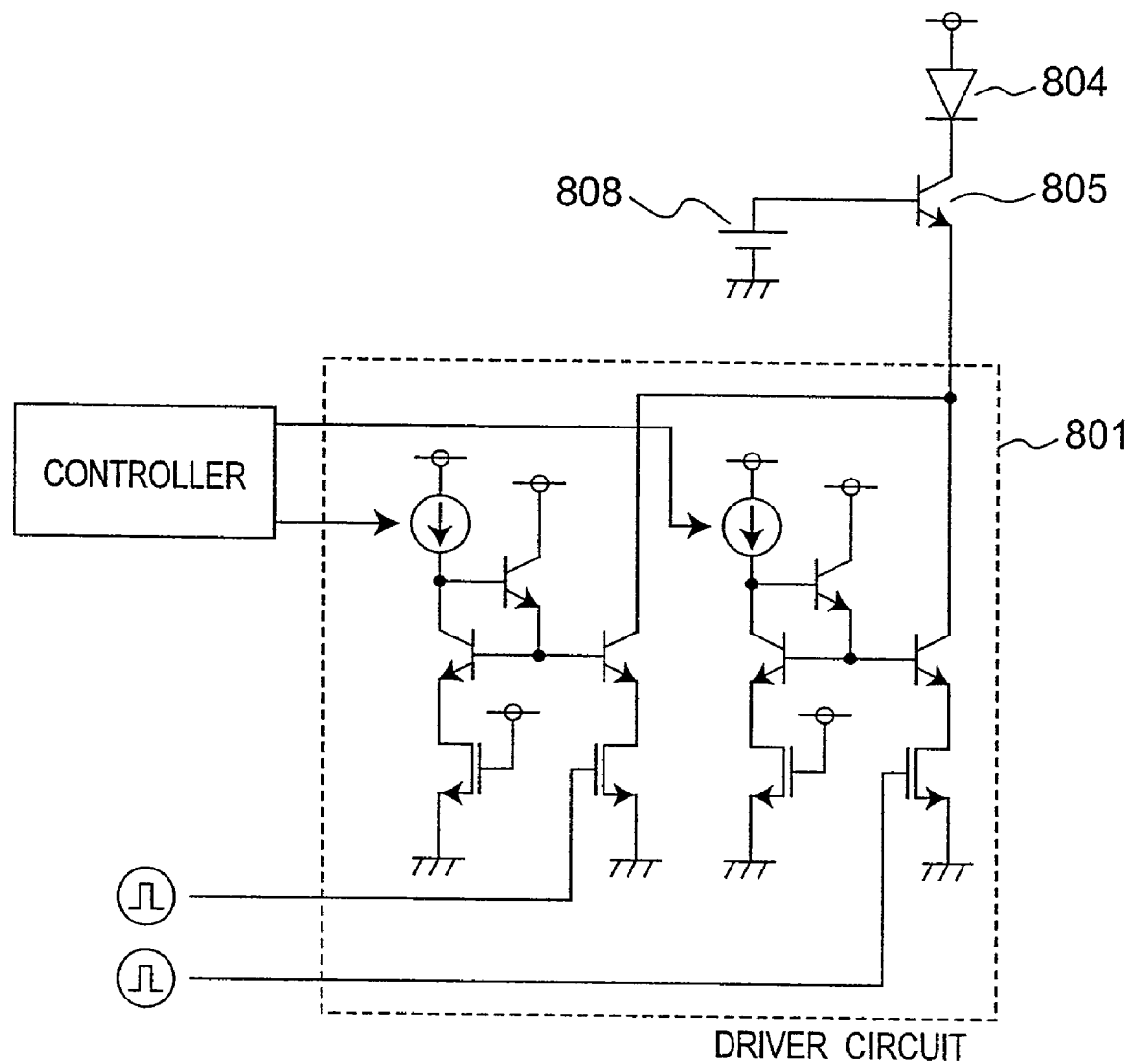
FIG. 8 is a circuit diagram showing the configuration of a conventional laser driving circuit.
Figure 9:
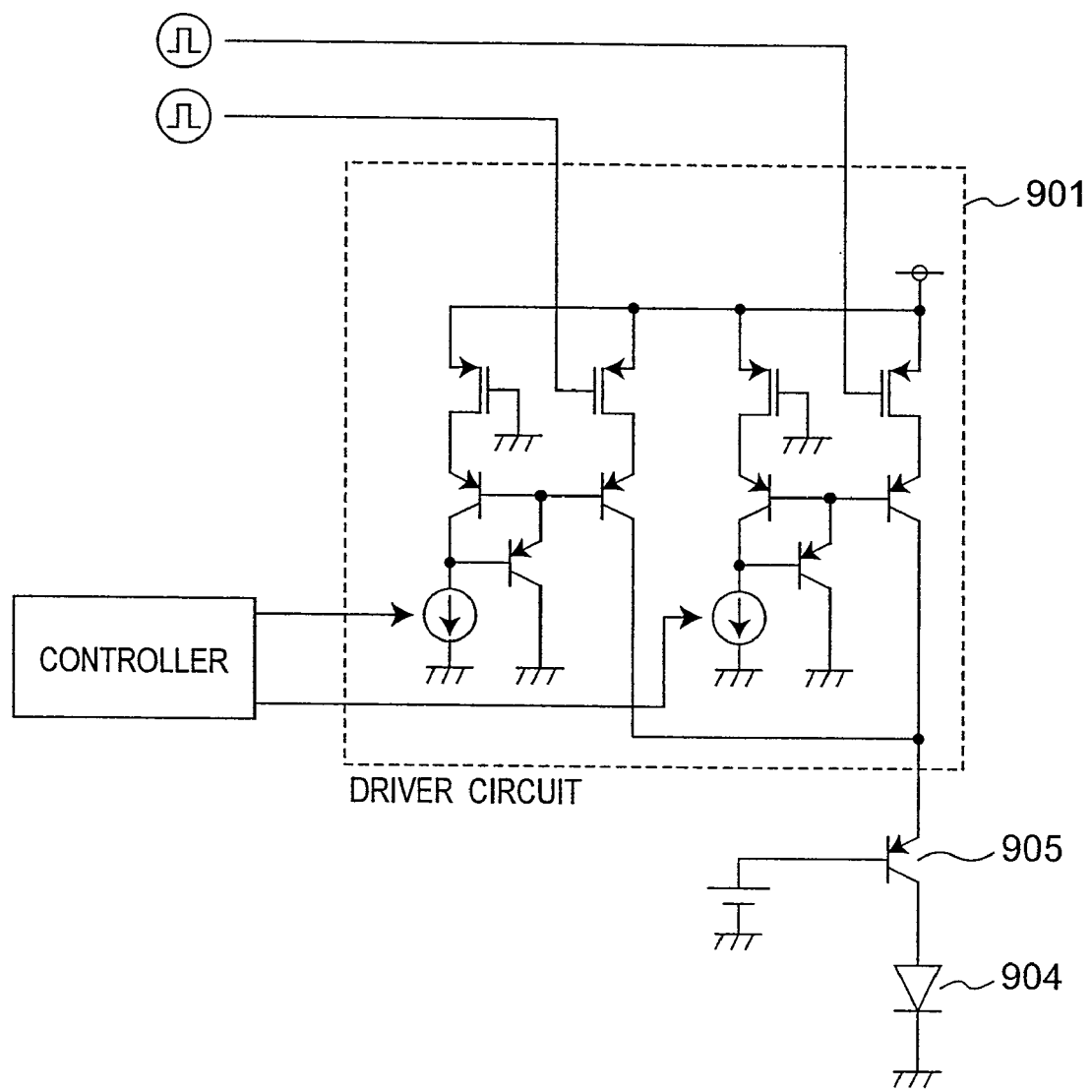
FIG. 9 is a circuit diagram showing the configuration of another conventional laser driving circuit.
Figure 10:
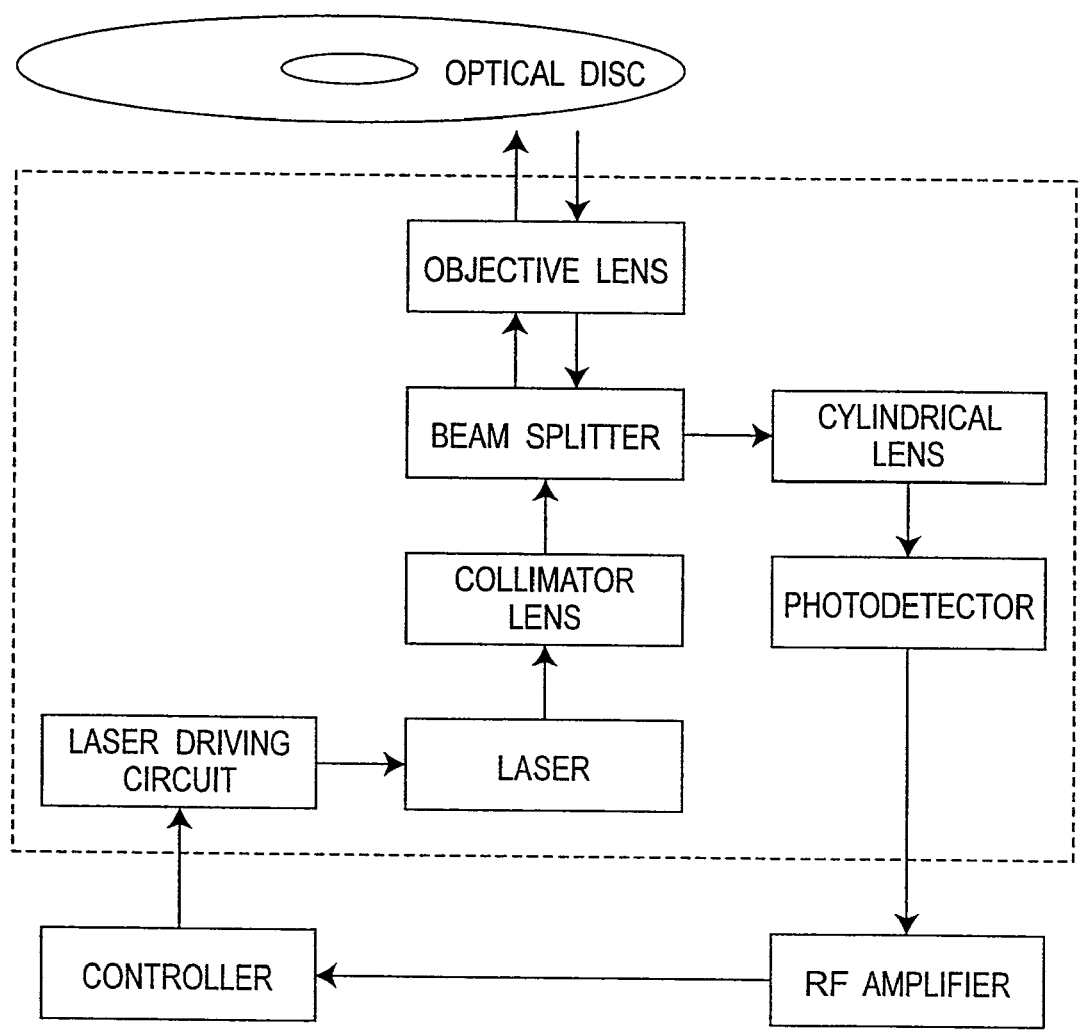
FIG. 10 is a schematic diagram showing the configuration of an optical pickup.

A third embodiment of the present invention will be described below. FIG. 7 is a circuit diagram showing the configuration of a laser driving circuit according to the third embodiment. While the laser driving circuit according to the third embodiment is designed to discharge a current therefrom as with the second embodiment, it is different from the second embodiment in that a cathode of a semiconductor laser is grounded, and a driver-source-voltage control circuit is connected to a voltage source of a driver circuit. As shown in FIG. 7, a driver circuit 701 includes a current mirror circuit for mirroring a current set by a controller 702. Specifically, a Pch MOS transistor 7012 is connected between a voltage source and an emitter of a PNP transistor 7011 constituting the current mirror circuit, and a pulse signal 703 is connected to the Pch MOS transistor 7012. That is, the Pch MOS transistor 7012 is adapted to be turned on/off according to the pulse signal 703, so that the laser 704 generates a laser beam in a pulsed manner so as to form a recording mark on an optical disc.

A grounded-base cascode transistor 705 is connected between the driver circuit 701 and the laser 704 to reduce rise/fall times of a laser driving current corresponding to low/high states of the pulse signal. A base-voltage control circuit 706 is connected to a base of the cascode transistor 705. The base-voltage control circuit 706 is further connected to the controller 702. A driver-source-voltage control circuit 707 is connected to the voltage source of the driver circuit 701. The driver-source-voltage control circuit 707 is further connected to the controller 702.

Based on the above configuration, a base voltage of the cascode transistor 705 and a source voltage of the driver circuit 701 can be variably changed individually. Specifically, respective maximum values of the base voltage of the cascode transistor 705 and the source voltage of the driver circuit 701 can be set correspondingly to a maximum value of the laser driving current, and each of the base voltage of the cascode transistor 705 and the source voltage of the driver circuit 701 can be lowered in proportion to the laser driving current when it is set at a lower value than the maximum value thereof.

Thus, in the third embodiment, the base voltage of the cascode transistor 705 and the source voltage of the driver circuit 701 are lowered during normal use as compared with during the maximum laser driving current to reduce power consumption. This makes it passable to reduce heat generation in an optical pickup of a recording/reading equipment for the optical disc, as with the first and second embodiments.

As mentioned above, the laser driving circuit according to each of the first to third embodiments of the present invention, each of the base voltage of the grounded-base cascode transistor, and either one of the anode or cathode voltage of the laser and the source voltage of the driver circuit can be controlled according to the laser driving current to lower a voltage applied across the laser driving circuit and the laser when the laser driving current is set at a relatively low value so as to reduce power consumption in the laser driving circuit and the laser, particularly, during normal use. Thus, the laser driving circuit is useful as a laser driving technique of reducing heat generation in an optical pickup of a recording/reading equipment for an optical disc.

While the present invention has been described in conjunction with specific embodiments, various modifications and alterations will become apparent to those skilled in the art. Therefore, it is intended that the present invention is not limited to the illustrative embodiments herein, but only by the appended claims and their equivalents.

What is claimed is:

1. Laser driving circuit comprising:
   a laser-connecting terminal to which one electrode of a semiconductor laser is connected;
   a driver circuit adapted to supply a current to said laser;
   a grounded-base circuit serially connected between said laser and said driver circuit;
   a base-voltage control circuit connected to said grounded-base circuit and adapted to control a base voltage of said grounded-base circuit;
   a controller connected to each of said driver circuit and said base-voltage control circuit, and adapted to set a value of the current to be supplied from said driver circuit to said laser connected to said laser-connecting terminal; and
   an electrode-voltage control circuit connected to each of said controller and an other electrode of said laser, and adapted to control a voltage at the other electrode of said laser.

2. A laser driving circuit comprising:
   a laser-connecting terminal to which one electrode of a semiconductor laser is connected;
   a driver circuit adapted to supply a current to said laser;
   a grounded-base circuit serially connected between said laser and said driver circuit;
   a base-voltage control circuit connected to said grounded-base circuit and adapted to control a base voltage of said grounded-base circuit;
   a controller connected to each of said driver circuit and said base-voltage control circuit, and adapted to set a value of the current to be supplied from said driver circuit to said laser connected to said laser-connecting terminal; and
   a source-voltage control circuit connected to each of said controller and said driver circuit, and adapted to control a source voltage of said driver circuit.

3. The laser driving circuit according to claim 2, wherein said base-voltage control circuit includes a digital-analog converter circuit.

4. The laser driving circuit according to claim 2, wherein said base-voltage control circuit includes a current-voltage converter circuit adapted to convert a current value corresponding to said setup current value of said driver circuit, to a voltage value.

5. An optical pickup comprising the laser driving circuit according to claim 2.

6. A recording/reading equipment comprising the laser driving circuit according to claim 2.

7. A recording/reading equipment comprising the optical pickup according to claim 5.

\* \* \* \* \*